(12) United States Patent
Huppmann et al.

(10) Patent No.: US 10,923,400 B2
(45) Date of Patent: Feb. 16, 2021

(54) METHOD FOR PRODUCING A PLURALITY OF COMPONENTS

(71) Applicant: OSRAM OLED GMBH, Regensburg (DE)

(72) Inventors: Sophia Huppmann, Geldersheim (DE); Dominik Scholz, Bad Abbach (DE); Simeon Katz, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 246 days.

(21) Appl. No.: 16/068,051

(22) PCT Filed: Jan. 24, 2017

(86) PCT No.: PCT/EP2017/051423
§ 371 (c)(1),
(2) Date: Jul. 3, 2018

(87) PCT Pub. No.: WO2017/129562
PCT Pub. Date: Aug. 3, 2017

(65) Prior Publication Data
US 2020/0235012 A1    Jul. 23, 2020

(30) Foreign Application Priority Data
Jan. 26, 2016   (DE) .................. 10 2016 101 347

(51) Int. Cl.
*H01L 21/82* (2006.01)
*H01L 23/00* (2006.01)
(52) U.S. Cl.
CPC .............. *H01L 21/82* (2013.01); *H01L 24/80* (2013.01); *H01L 2224/80894* (2013.01)

(58) Field of Classification Search
None
See application file for complete search history.

(56) References Cited

U.S. PATENT DOCUMENTS

2009/0179207 A1   7/2009   Chitnis et al.
2012/0098025 A1   4/2012   Hoppel
(Continued)

FOREIGN PATENT DOCUMENTS

| DE | 102013109316 A1 | 12/2014 |
| WO | 2015/049079 A1 | 4/2015 |
| WO | 2017/093327 A1 | 6/2017 |

*Primary Examiner* — Asok K Sarkar
(74) *Attorney, Agent, or Firm* — MH2 Technology Law Group LLP

(57) ABSTRACT

The invention relates to a method for producing a plurality of components (100), wherein a carrier composite (10) is provided with a coherent base body (13) and a wafer composite (200) is provided with a coherent semiconductor body composite (20) and a substrate (9). The wafer composite is connected to the carrier composite to form a common composite. In a subsequent method step, a plurality of separation channels (60) are generated at least through the base body (13) to form a grid structure (6), which determines the dimensions of the components (100) to be produced. A passivation layer (61) is shaped in such a way that it covers the side surfaces of the separation channels (60). Finally, the common composite is separated, wherein the substrate (9) is removed from the semiconductor body composite (20) and the common composite is separated along the separation channels (60) to form a plurality of components (100).

18 Claims, 7 Drawing Sheets

(56) References Cited

U.S. PATENT DOCUMENTS

Figure 1A:
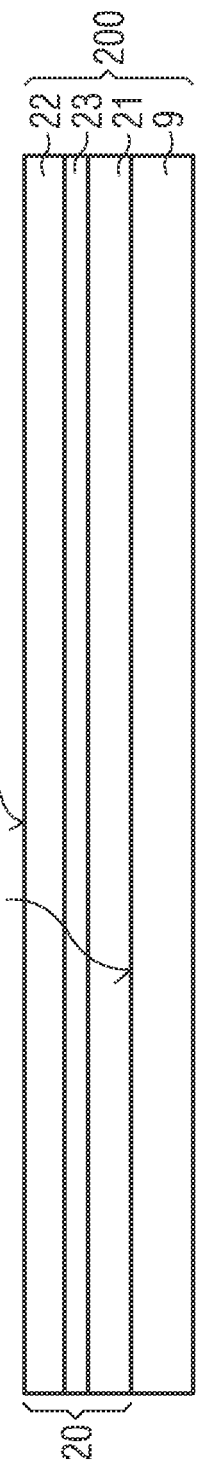

| | | |
|---|---|---|
| 2012/0322240 A1 | 12/2012 | Holden et al. |
| 2013/0095581 A1 | 4/2013 | Lee et al. |
| 2016/0111615 A1* | 4/2016 | von Malm ........ H01L 27/14636 257/98 |
| 2016/0218097 A1* | 7/2016 | Plossl .................... H01L 33/06 |
| 2017/0096130 A1 | 4/2017 | Drumm et al. |

* cited by examiner

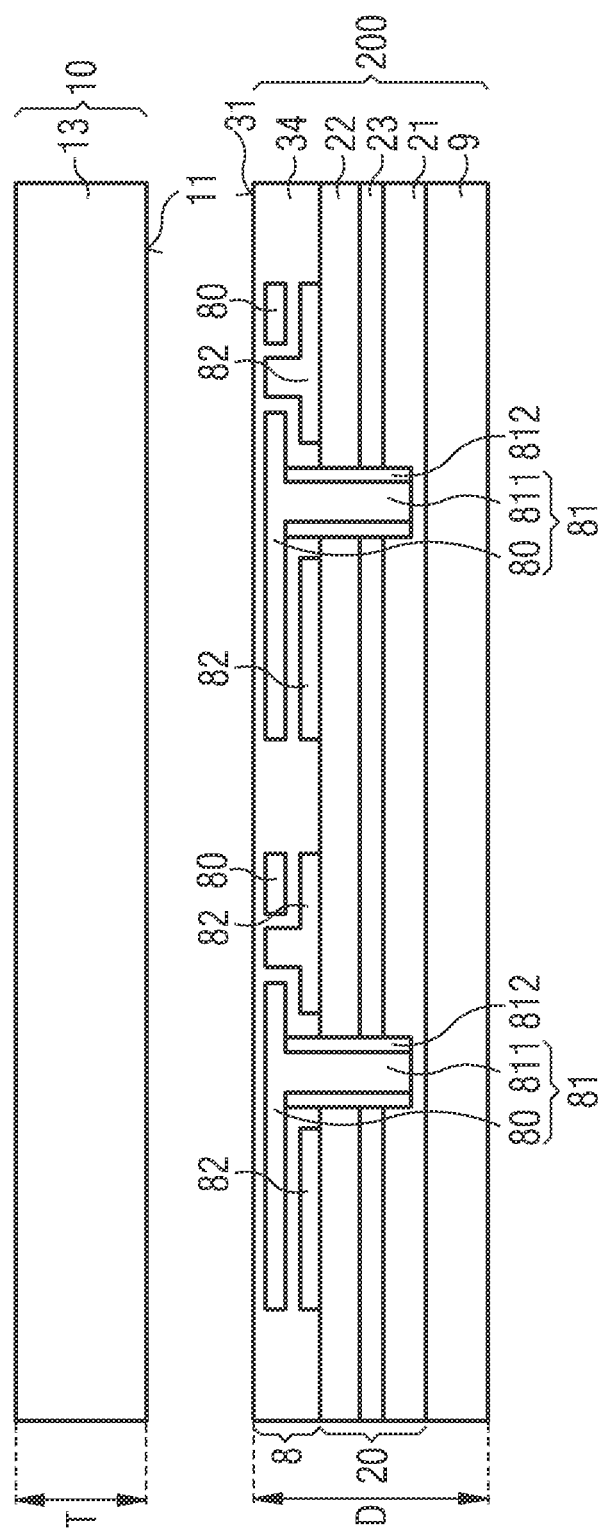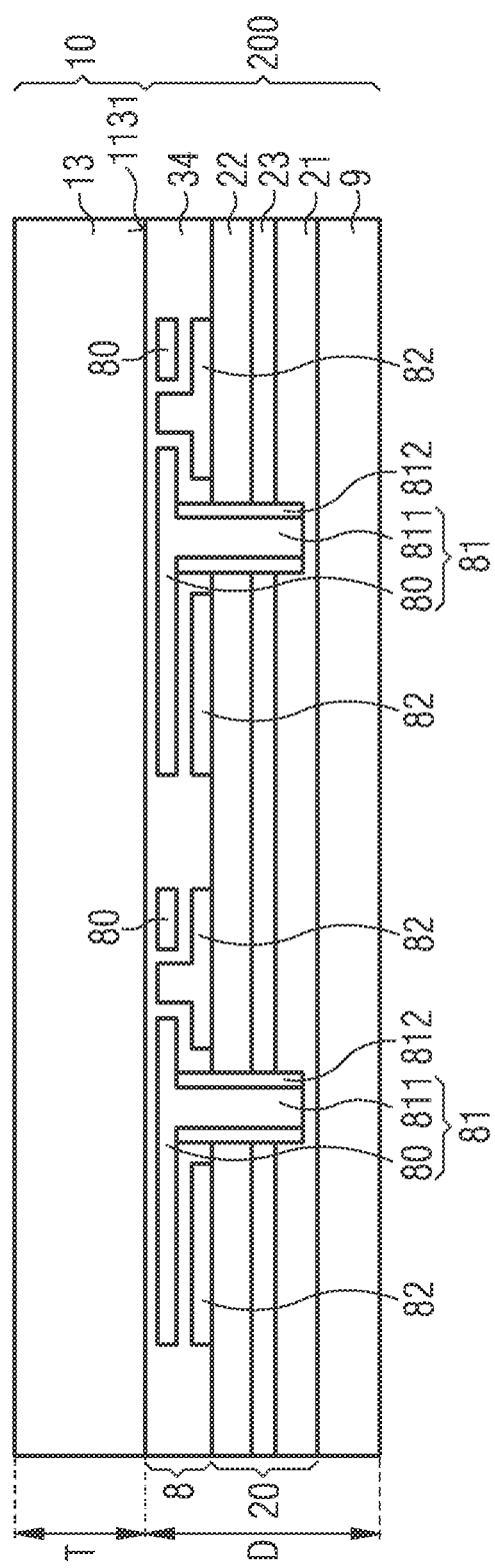

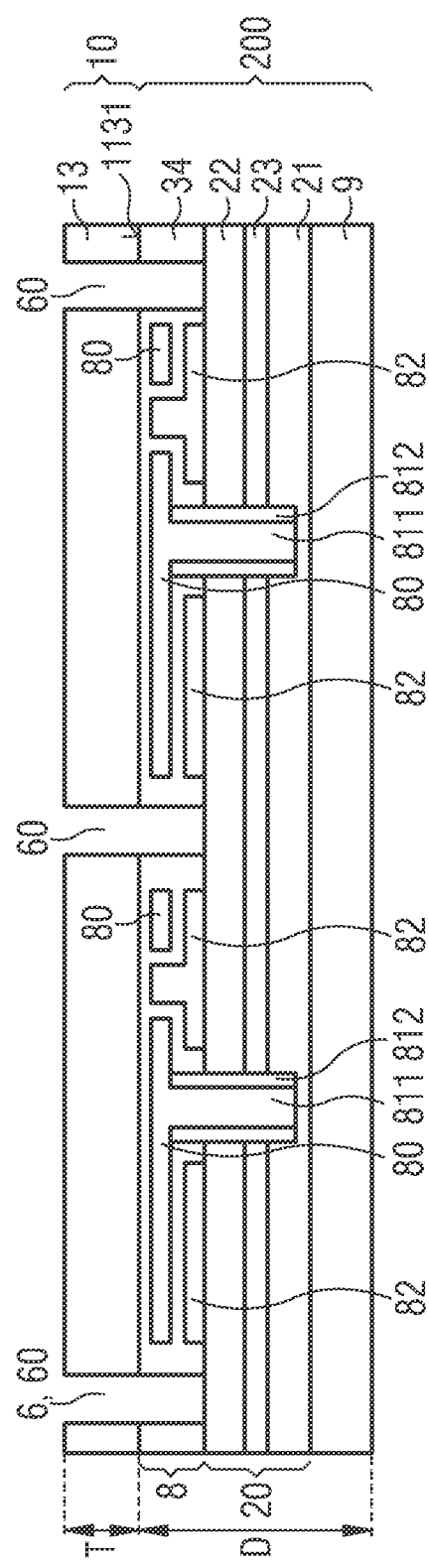

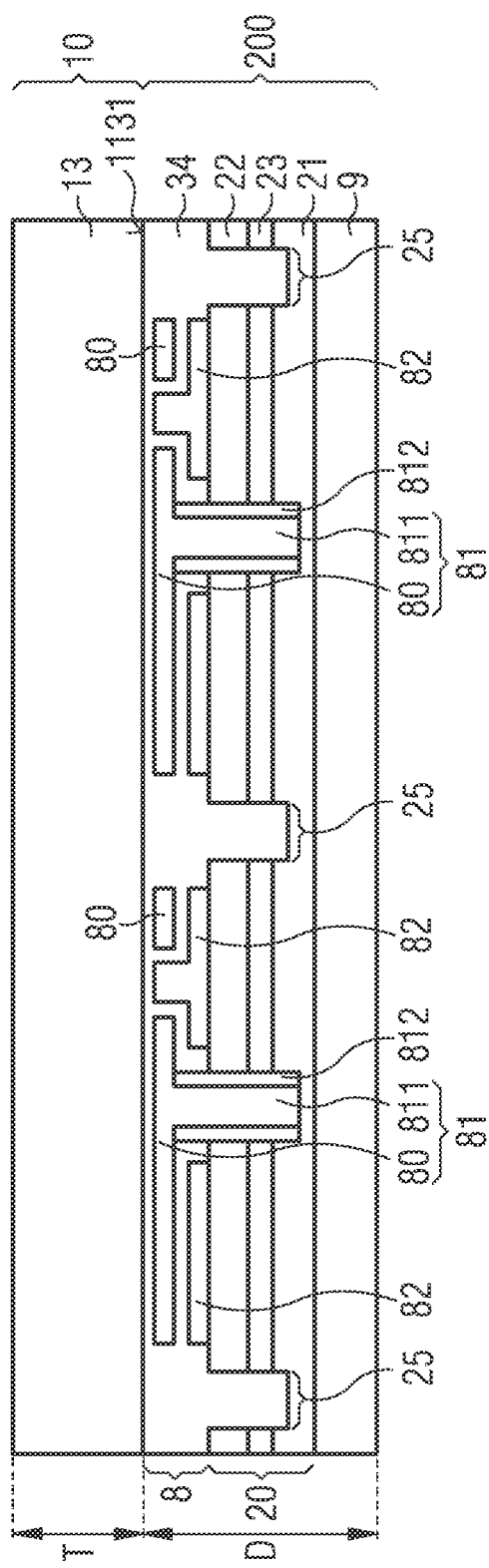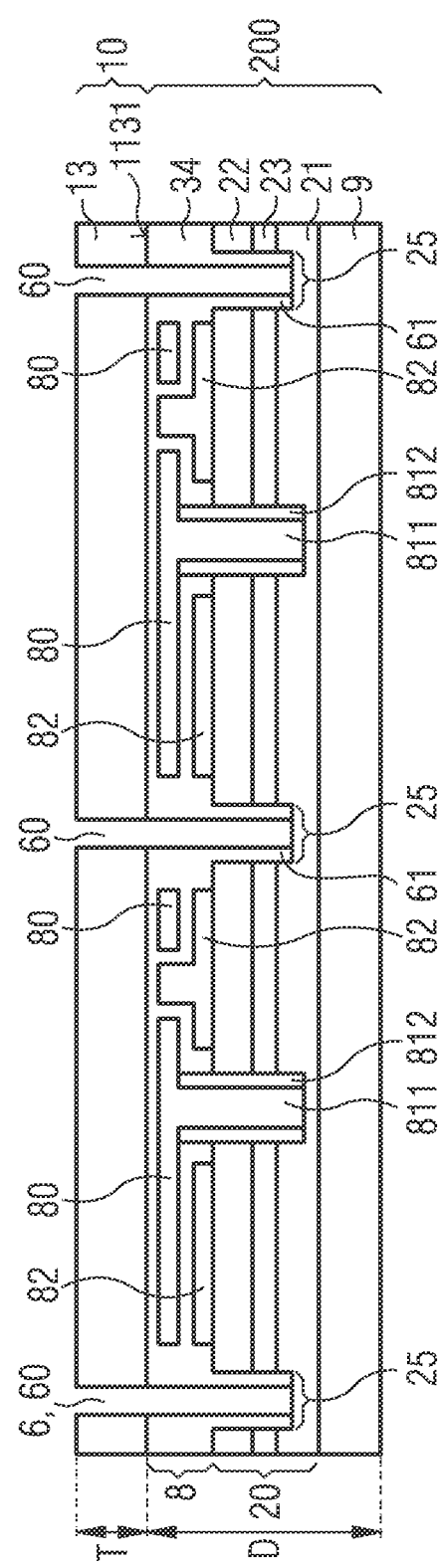

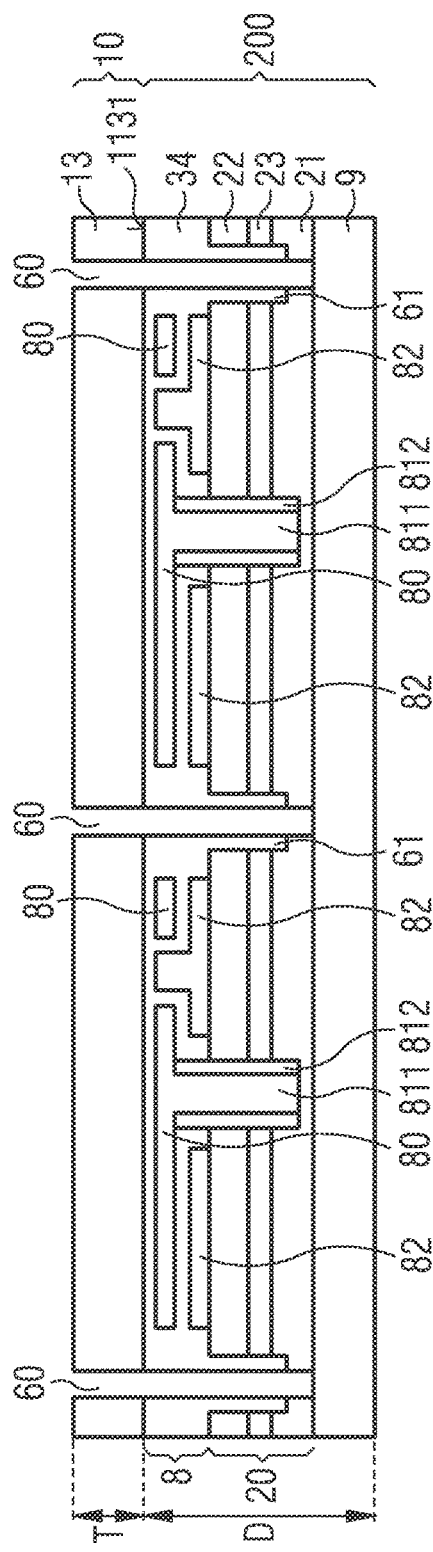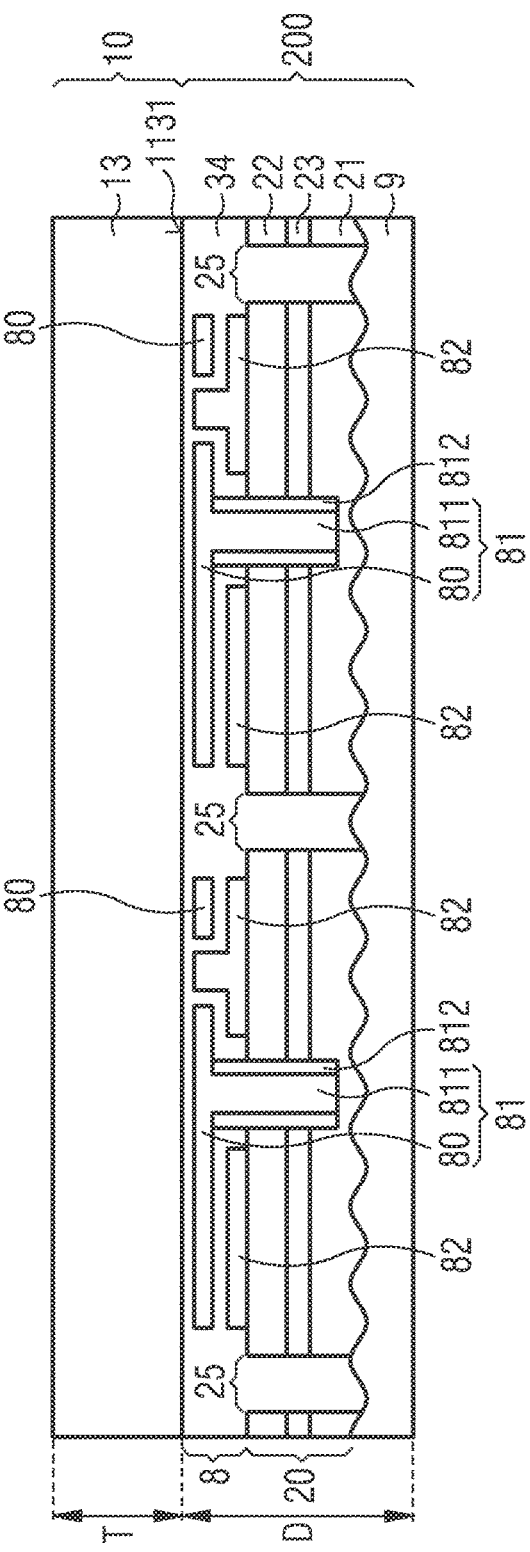

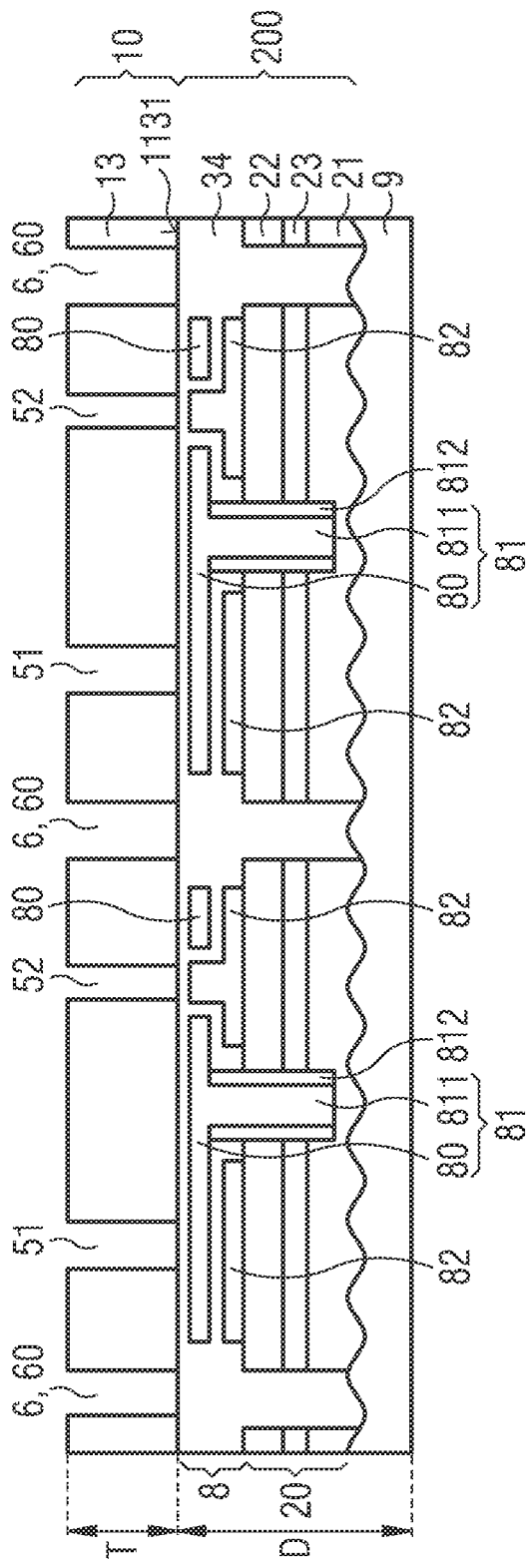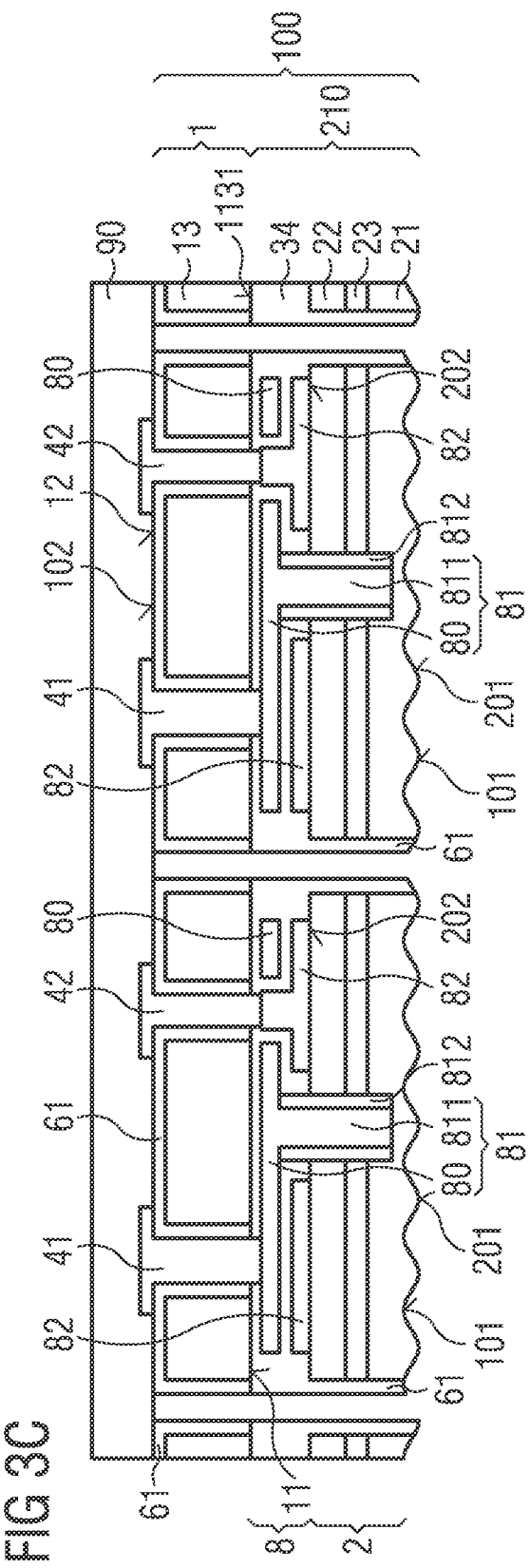

METHOD FOR PRODUCING A PLURALITY OF COMPONENTS

A method for producing a plurality of components is provided.

In the production of a plurality of components, in general, a semiconductor body composite is first grown epitaxially on a growth substrate, wherein the semiconductor body composite is singulated into a plurality of semiconductor bodies in a subsequent method step. Here, trenches are formed between the semiconductor bodies usually through a photolithography step, wherein for each trench an adjustment tolerance distance to an associated later separating trench has to be maintained, so that the trenches between the semiconductor bodies have to be designed to be sufficiently wide, as a result of which a considerable portion of the semiconductor body composite gets lost.

One object is to provide a reliable and efficient method for producing a plurality of components.

This object is solved, inter alia, by a method for producing a plurality of components according to the independent claim. Further embodiments and developments of the method are the subject-matter of the dependent claims.

In at least one embodiment of a method for producing a plurality of components, a carrier composite comprising a contiguous base body and a wafer composite comprising a contiguous semiconductor body composite and a substrate are provided. For forming a joint composite the wafer composite and the carrier composite are connected to one another. In a next step, a plurality of separating trenches are formed at least throughout the base body in order to form a grid structure. The grid structure defines in particular the dimensions of the components to be produced. A passivation layer is formed which covers for instance side surfaces of the separating trenches. The passivation layer can be formed partially or completely prior to or after the formation or at least partially during the formation of the separating trenches. The joint composite is subsequently singulated, wherein the substrate is detached from the semiconductor body composite. In particular, the joint composite is singulated into a plurality of components along the separating trenches in the course of the detachment of the substrate.

According to at least one embodiment of the method, the contiguous base body is composed of an electrically insulating or semi-conductive material. Here, at least 80%, for instance at least 90% or at least 95%, of the volume and/or of the weight of the carrier composite result from the base body. The base body preferably comprises a semiconductor material such as silicon or consists of a semiconductor material such as silicon.

According to at least one embodiment of the method, the carrier composite has an exposed, preferably planar connecting surface. In particular, the connecting surface delimits the carrier composite in a vertical direction. The connecting surface is formed in particular by a contiguous surface of the carrier composite which extends for instance in lateral directions over the entire main plane of extension of the carrier composite. The exposed connecting surface can be a surface of the base body or of an especially electrically insulating layer arranged on the base body.

A planar surface is understood to mean a surface which is in particular microscopically flat. Preferably, such a planar surface has a local vertical roughness which is in particular less than 5 nm, less than 3 nm, preferably less than 1 nm or less than 0.5 nm. A vertical direction is understood to mean a direction which is directed in particular perpendicular to a main plane of extension of the carrier composite. A lateral direction is understood to mean a direction which extends for instance parallel to the main plane of extension of the carrier composite. In particular, the vertical direction and the lateral direction are directed transversely, for instance perpendicular to one another.

According to at least one embodiment of the method, the contiguous semiconductor body composite comprises a plurality of semiconductor layers arranged on top of one another. The substrate is in particular a growth substrate on which the semiconductor body composite is arranged. In particular, the semiconductor body composite is applied onto the growth substrate in layers, for instance deposited epitaxially. The wafer composite can have a contact structure which is configured for electrically contacting the semiconductor body composite. For example, the semiconductor body composite is arranged in the vertical direction between the contact structure and the substrate.

According to at least one embodiment of the method, the wafer composite has an exposed, preferably planar contact surface. In particular, the contact surface is an exposed surface of the wafer composite facing away from the substrate. The wafer composite can comprise an insulating layer having an exposed surface as a contact surface of the wafer composite. The insulating layer can comprise an electrically insulating oxide layer. In particular, the insulating layer is part of the contact structure.

According to at least one embodiment of the method, the joint composite of the carrier composite and the wafer composite is formed by a direct bonding method, in which the contact surface being formed in particular in a planar manner and the connecting surface being formed in particular in a planar manner are merged together for forming a joint interface. The joint interface can be an overlapping surface between the connecting surface and the contact surface, wherein the overlapping surface arises during the merging and thus separates the wafer composite from the carrier composite and vice versa. In a direct bonding method, the joint interface is in particular free of a connecting means, such as an adhesion promoter. Apart from this, it is also possible for the carrier composite and the wafer composite to be mechanically connected together by an alternative method, for instance by means of a connecting layer.

In a direct bonding method, in particular hydrophilic and hydrophobic surfaces are brought into physical contact. The basis of the mechanical connection is predominantly or exclusively given by hydrogen bridges and/or van-der-Waals interactions in the immediate vicinity of the joint interface. In a direct bonding method for forming the joint composite, the planar connecting surface and the planar contact surface can be brought together in such a way that the joint interface is formed by regions directly adjoining one another of the connecting surface and of the contact surface and in this case is free of a connecting material.

According to at least one embodiment of the method, internal mechanical stresses, such as shear stresses, are reduced in the composite comprising the carrier composite and the wafer composite. As a result, potential defect surface at the joint interface can be narrowed. The internal mechanical stresses in the composite can be reduced by removing the material of the composite for instance in places. For example, after being connected to the wafer composite, the carrier composite can be thinned, for example thinly grinded. In this case, the material of the carrier composite, in particular of the base body, can be removed in places in such a way that the carrier composite, in particular the base body, has a reduced vertical layer thickness. The total thickness of the carrier composite can thus be reduced by targeted removal of material. Alternatively or additionally, it is possible to reduce the internal stresses by forming recesses in the composite, for example in the carrier composite and/or in the wafer composite.

In particular in a direct bonding method, even small defects on the connecting surface or on the contact surface may result in the forming of large-scale defect surfaces and thus in large-scale failures of semiconductor components. A radius of such defect surface depends inter alia on the layer thicknesses of the wafer composite and of the carrier composite. A reduction in the layer thickness of the carrier composite can lead to a reduction in the defect surface. Also the removal of material, for example by forming recesses in the composite, leads to spatial isolation of the defect and thus likewise to a reduction of the defect surface.

According to at least one embodiment variant, the reduction of mechanical stresses in the composite is carried out step by step. As a result, the failures of the components can be minimized, since in particular only components which are directly affected by foreign particles cannot be bonded. As a result of the reduction of the layer thickness, which is carried out only after connecting the carrier composite to the wafer composite, the carrier composite can be designed to be particularly mechanically stable, for example when applied to the wafer composite, wherein components having particularly low structural heights can be achieved by this embodiment variant on account of the subsequent reduction of the total layer thickness of the composite.

According to at least one embodiment of the method, a thermal treatment of the composite takes place after the reduction of the internal stresses. Such a thermal treatment can lead to the establishment of covalent bonds between atoms or molecules on the connecting and contact surfaces being in physical contact to one another, and thus leads to an increased bond strength between the wafer composite and the carrier composite. If the thermal treatment is carried out after the partial material removal, the potential defect surface can be minimized, before the mechanical connection between the wafer composite and the carrier composite is additionally strengthened by the thermal treatment. The thermal treatment, however, can be optional.

According to at least one embodiment of the method, the connecting surface of the carrier composite is formed in places or exclusively by the surface of an oxide layer, for example of a silicon oxide layer, in particular of an SiO2 layer. Preferably, the base body is made of silicon or consists of silicon. A silicon oxide layer can be formed in a particularly simple manner on a silicon base body, for instance by deposition of silicon oxide such as SiO2 on the base body or by oxidation of the base body. The contact surface of the wafer composite can be formed in places or exclusively by a surface of an oxide layer, for example of a silicon oxide layer, in particular of an SiO2 layer. A component comprising a silicon body configured as a carrier has a particularly low thermal resistance and a higher mechanical break resistance for example in comparison with a mold body.

According to at least one embodiment of the method, the step for producing the separating trenches throughout the base body and the step for producing the separating trenches throughout the semiconductor body composite are carried out at least partially by two mutually different method steps. This means in particular that the separating trenches are not produced in a single method step both throughout the base body and throughout the semiconductor body composite.

In particular, the separating trenches are formed in a first method step in such a way that the separating trenches are produced throughout the base body, wherein the separating trenches do not extend or at most only partially extend into the semiconductor body composite after the first method step. The latter means that during the first method step the separating trenches are formed in particular throughout the carrier composite and/or throughout the contact structure of the wafer composite into the semiconductor body composite, wherein after the first method step the separating trenches do not extend throughout the semiconductor body composite. In a second method step being different from the first method step, the separating trenches are formed throughout the semiconductor body composite for instance as far as the substrate, so that the semiconductor body composite is separated into a plurality of individual semiconductor bodies arranged next to one another. In this case, the semiconductor bodies are arranged on the common substrate and are spatially separated from one another by the separating trenches in lateral directions. The substrate can in this case be partially exposed in the regions of the separating trenches.

According to at least one embodiment of the method, the grid structure is formed by the separating trenches extending throughout the base body, wherein the grid structure serves as an etching mask during the second method step and the semiconductor body composite is etched through by guiding an etching agent into the grid structure.

According to at least one embodiment variant of the method, prior to the formation of the separating trenches, the semiconductor body composite is unstructured. Thus, before or during wafer bonding, that is to say before or during the connection of the wafer composite to the carrier composite, the separating trenches or regions of the semiconductor body composite provided for the formation of the separating trenches have not been established yet, for example have not been defined lithographically. The sizes of the components to be produced are determined in particular only during the forming of the grid structure comprising the separating trenches extending throughout the base body or throughout the carrier composite. Thus, during the wafer bonding, the semiconductor body composite is formed in particular in one piece and is for instance free of mesa trenches which define the dimensions of the semiconductor bodies and thus of the components to be formed.

In particular, the semiconductor body composite is structured into a plurality of semiconductor bodies only after the formation of the separating trenches throughout the base body. Following the structuring of the carrier composite or of the base body, in particular without a separate lithography step, the wafer composite or the semiconductor body composite can thus be singulated in a self-adjusting manner with regard to the grid structure. Here, an etching method can be used, such as plasma etching or a depth reactive ion etching method (DRIE) or a reactive ion etching method (Cl-RIE) using chlorine as an etching agent. In particular prior to the wafer bonding, the formation of a mask, for instance using a photo-technique with a photo-structurable material on the wafer composite, can be waived. Since the semiconductor body composite is unstructured during wafer bonding and in particular following the formation of the separating trenches in the region of the base body, that is to say following the formation of the grid structure, the separating trenches are produced in a completely self-adjusting manner in the region of the semiconductor body composite, a largest possible surface utilization of the semiconductor body composite can be achieved, since a potential compliance with an adjustment tolerance distance of the separating trenches within the region of the semiconductor body composite to the separating trenches located in the carrier composite is omitted. Overall, the efficiency of the method is thus increased. Moreover, in comparison to conventional methods, at least one lithography step is saved. Furthermore, the risk of delamination can also be significantly reduced by using an etching method for separating the components.

According to at least one variant of an embodiment of the method, prior to the wafer bonding, in particular prior to the formation of the separating trenches throughout the base body, the semiconductor body composite is partially or completely structured. This means that in particular during wafer bonding, the semiconductor body composite already has a plurality of openings in the locations provided for forming the separating trenches. Thus, already prior to the wafer bonding, these openings of the semiconductor body composite essentially define the dimensions of the semiconductor bodies and thus of the components to be produced. The openings can be filled, in particular completely filled, with an electrically insulating material. After the wafer bonding, in a plan view of the carrier composite, in particular of the base body, the openings are covered completely. In a subsequent method step, the separating trenches are formed throughout the base body for instance directly through the openings located underneath.

According to at least one embodiment of the method, the semiconductor body composite comprises a first semiconductor layer facing the substrate, a second semiconductor layer facing away from the substrate and an active layer arranged between the first and the second semiconductor layers. The openings in the semiconductor body can be formed in such a way that they extend throughout the second semiconductor layer and the active layer. In this case, each of the openings may form a blind hole in the semiconductor body composite. This means that the openings extend in particular only into the first semiconductor layer. Alternatively, it is possible for the openings to be formed prior to the wafer bonding, for instance from a main surface of the semiconductor body composite facing away from the substrate throughout the semiconductor body composite in particular as far as the substrate, and to be filled with an electrically insulating material in a further method step.

According to at least one variant of an embodiment of the method, the parts of the separating trenches located in the region of the semiconductor body composite are formed at least in places by partially removing the electrically insulating material located in the openings. The resulting side surfaces of the separating trenches are covered in particular by the remaining electrically insulating material. The remaining electrically insulating material thus forms the passivation layer at least in places, wherein the passivation layer may cover the side faces of the separating trenches partially or completely. For example, it is possible for the separating trenches to be not covered by the passivation layer for instance in the region of the base body, that is to say to be free of the passivation layer in the region of the base body. In particular, the side faces of the separating trenches are side surfaces of the components to be produced.

According to at least one embodiment of the method, the formation of the separating trenches in the region of the semiconductor body composite is carried out exclusively by partially removing the electrically insulating material located in the openings. The side surfaces of the separating trenches in the region of the semiconductor body composite are completely covered in particular by the remaining electrically insulating material. The remaining electrically insulating material thus forms the passivation layer or a subregion of the passivation layer which for instance completely covers the subregions of the side surfaces of the separating trenches located in the region of the semiconductor body composite and/or in the region of the contact structure. The subregions of the side surfaces of the separating trenches located in the carrier composite or in the base body can be formed by a further subregion of the passivation layer. The further subregion of the passivation layer is applied to the side surfaces of the separating trenches in particular only after the formation of the grid structure or after the formation of the separating trenches throughout the base body. The subregion and the further subregion of the passivation layer can have the same electrically insulating material or different insulating materials.

According to at least one embodiment of the method, the passivation layer is formed partially or completely only after the formation of the separating trenches throughout the base body and/or after the formation of the separating trenches through the semiconductor body. The passivation layer can be formed in such a way that it covers, in particular completely covers a rear side of the carrier composite facing away from the wafer composite.

According to at least one embodiment of the method, the substrate is a growth substrate, for example a sapphire substrate. The substrate can have a structured surface on which the semiconductor body composite may be epitaxially grown in such a way that the semiconductor body composite has a main surface which faces towards the growth substrate and reproduces the structured surface of the growth substrate. The substrate can be detached from the semiconductor body composite in such a way that, immediately after detaching the growth substrate, the singulated components each have a structured main surface. Alternatively, it is also possible for the growth substrate to be free of a structured surface. After detaching the growth substrate, the singulated components can be subsequently structured in such a way that they each have a structured main surface. The structured main surface of the respective component is formed in particular as a radiation passage and/or radiation exit surface. Using a structured growth substrate, the formation for instance of coupling-out structures can be realized in a simplified manner on a radiation passage or on a radiation exit surface of a component. This is because a roughening process can be dispensed with. In addition, the detachment of the substrate, for instance using a laser lifting method, can be placed in particular at the end of the manufacturing process, so that the particularly mechanically stable substrate can be used as a hard carrier during the manufacturing process.

According to at least one embodiment of the method, prior to the detachment of the substrate, an auxiliary carrier, for instance in the form of a foil, is applied to the joint composite in such a way that the joint composite comprising the wafer composite and the carrier composite is arranged between the substrate and the auxiliary carrier. After detaching the substrate from the composite, the singulated components lie well arranged on the auxiliary carrier and can be further processed in a simplified manner. In particular, the auxiliary carrier is stretchable, in particular elastically stretchable. A lateral distance between the singulated components arranged on the auxiliary carrier can be adjusted correspondingly to the extensibility of the auxiliary carrier, so that the further processing of the singulated components is simplified for example by using a pick-and-place machine.

Further advantages, preferred embodiments and further developments of the method will become apparent from the exemplary embodiments explained below in conjunction with FIGS. 1A to 3C.

FIGS. 1A to 1H show schematic sectional views of different method stages of an exemplary embodiment for producing a plurality of components, and FIGS. 2A to 3C show schematic sectional views of some method stages of further embodiments for producing a plurality of components.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

FIG. 1A shows a wafer composite 200. The wafer composite 200 comprises a semiconductor body composite 20 arranged on a substrate 9. The substrate 9 is in particular a growth substrate, for example a sapphire substrate. The semiconductor body composite 20 can be deposited in layers on the substrate 9, for example by an epitaxy method.

The semiconductor body composite 20 has a first main surface 201 facing the substrate 9 and a second main surface 202 facing away from the substrate 9. In particular, the first main surface 201 is formed by a surface of a first semiconductor layer 21 of a first, for instance n-conducting charge carrier type and the second main surface 202 is formed by a surface of a second semiconductor layer 22 of a second, for instance p-type conducting charge carrier type. The semiconductor body composite 20 comprises an active layer 23, which is arranged between the first semiconductor layer 21 and the second semiconductor layer 22. In particular, the active layer is a pn-junction zone. During operation of the component to be produced, the active layer 23 is configured preferably for detecting or for emitting electromagnetic radiations for example in the visible, ultraviolet or infrared spectral range. In particular, the components to be produced are optoelectronic components, in particular light-emitting diodes.

The semiconductor body composite 20 can be formed from a III/V compound semiconductor material. A III/V compound semiconductor material has an element from the third main group, such as B, Al, Ga, In, and an element from the fifth main group, such as N, P, As. In particular, the term "III/V compound semiconductor material" comprises the group of binary, ternary or quaternary compounds which comprise at least one element from the third main group and at least one element from the fifth main group, for example nitride and phosphide compound semiconductors. For example, the semiconductor layers 21 and 22 are based on GaN. The semiconductor material can additionally contain, for example, one or more dopants and additional constituents. The semiconductor body composite 20 can also be made of a II/VI compound semiconductor material.

Figure 1B:
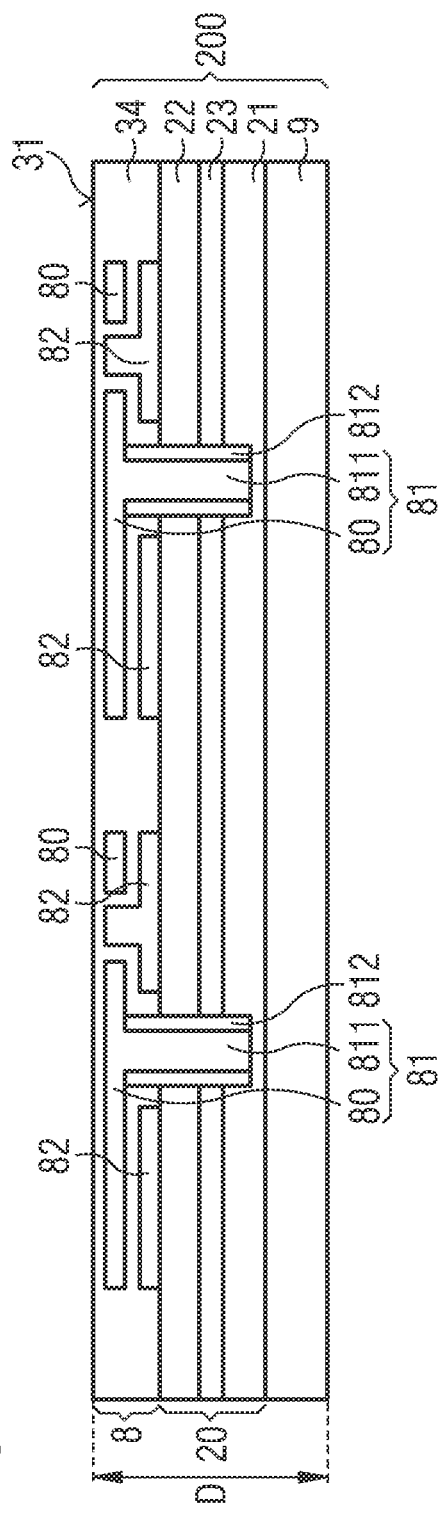

According to FIG. 1B, a contact structure 8 of the wafer composite 200 is formed which is configured for electrically contacting the composite semiconductor body 20. The semiconductor body composite 20 is arranged between the substrate 9 and the contact structure 8. The contact structure 8 has an electrically conductive layer 80 and connection layers 81 and 82. The electrically conductive layer 80 can be formed as a highly reflective mirror layer. In particular, the electrically conductive layer 80 is part of a first connection layer 81. The first connection layer 81 also has a through-via 811 which extends in the vertical direction for instance from the second main surface 202 of the semiconductor body composite 20 through the second semiconductor layer 22 and active layer 23 into the first semiconductor layer 21. An isolation structure 812 is arranged within the semiconductor body composite 20 in places, completely surrounds the through-via 811 and electrically isolates the through-via from the second semiconductor layer 22 and the active layer 23.

According to FIG. 1B, a second connection layer 82 is arranged in the vertical direction between the semiconductor body composite 20 and the electrically conductive layer 80. The second connection layer 82 has an opening through which the through-via 811 extends. Likewise, the electrically conductive layer 80 has an opening through which the second connection layer 82 extends in places. In particular, the connection layers 81 and 82 are assigned to different electrical polarities of a component to be produced. In particular, the first connection layer 81 is configured for electrically contacting the first semiconductor layer 21 and the second connection layer 82 for electrically contacting the second semiconductor layer 22. The connection layers 81 and 82 are electrically isolated from each other by an insulating layer 34, for instance by a silicon oxide layer or a silicon nitride layer. In a plan view, the insulating layer 34, as illustrated in FIG. 1B, completely covers the connection layers 81 and 82.

The insulating layer 34 has an exposed, in particular planar contact surface 31. The planar contact surface 31 is preferably microscopically flat to such an extent that the contact surface 31 can serve, for example, as an interface for the direct bonding of the wafer composite 200. According to FIG. 1B, the planar contact surface 31 is formed exclusively by the surface of the insulating layer 34. In contrast to this, it is also possible for the insulating layer 34 to be polished in such a way that the planar contact surface 31 arising therefrom is formed in regions by surfaces of the insulating layer 34 and in regions by surfaces of the connection layers 81 and/or 82. According to FIG. 1B, the wafer composite 200 comprising the substrate 9, the semiconductor body composite 20 and the contact structure 8 has a vertical layer thickness D.

In FIG. 1B, the wafer composite 200 has a plurality of contact structures 8 assigned in each case to one of the components to be produced, wherein the first connection layers 81 and the second connection layers 82 in each case are spatially separated from each other in the lateral direction. Deviating therefrom, it is also possible that the first connection layers 81 are initially formed in a contiguous manner during this method stage and are separated from one another only in a subsequent method step, for instance when the separating trenches are formed. Analogously, this applies equally to the second connection layers 82.

According to FIG. 1C, a carrier composite 10 having a vertical layer thickness T is provided. The carrier composite 10 has a base body 13 and comprises a connecting surface 11. The connecting surface 11 is preferably formed to be planar. The connecting surface is formed in particular by an exposed surface, for instance an oxidized surface, of the base body 13. It is also possible for the connecting surface 11 to be formed by an exposed surface of a layer arranged on the base body 13, for example of an electrically insulating oxide layer, for example an SiO2 layer. If the base body is made of silicon, the connecting surface 11 can be a surface of an SiO2 layer, which can be produced by oxidizing the base body 13 or by an SiO2 coating.

According to FIG. 1D, the wafer composite 200 is mechanically connected to the carrier composite 10 for forming a joint composite. The contact surface 31 and the connecting surface 11 are merged together for forming a joint interface 1131. By virtue of the planar surfaces having particularly low roughness, even without the use of a connecting material such as an adhesion promoter, the wafer composite 200 and the carrier composite 10 can be mechanically connected together exclusively owing to van-der-Waals interactions and/or hydrogen bridge connections between the atoms on the planar surfaces. Alternatively, it is possible to connect the wafer composite 200 to the carrier composite 10 in a mechanically stable manner using a connecting layer.

FIG. 1D shows the joint interface 1131 in a direct bonding method. In particular, the joint interface 1131 is formed by mutually directly adjacent regions of the joining surface 11 and of the contact surface 31. The joint interface 1131 thus represents a physical contact zone between the wafer composite 200 and the carrier composite 10. In particular in the case of a direct bonding method, a defect surface can be present at the joint interface 1131 (not shown here), wherein the defect surface, for example, is due to contaminants, for instance to foreign particles between the wafer composite 200 and the carrier composite 10, or to local roughnesses which are comparatively oversized for the direct bonding method on the planar contact surface 31 and/or on the planar connecting surface 11.

It has been found that a lateral radius of the defect surface depends, inter alia, on the vertical layer thickness T of the carrier composite 10, on the vertical layer thickness D of the wafer composite 200 and on the material quality of the carrier composite 10 as well as of the wafer composite 200. According to FIG. 1E, for downsizing the possible defect surface, the vertical layer thickness of the carrier composite 10, for instance, is reduced after connection to the wafer carrier 200. Preferably, the base body 13 is thinned to a target thickness in the component to be produced. In particular, the carrier composite 10 can be thinned in such a way that the vertical layer thickness of the carrier composite 10 and/or of the base body 13 is reduced by at least 50% of its original value. After the reduction, the vertical layer thickness of the carrier composite 10 and/or of the base body 13 is in particular between 50% and 5% inclusive, for example between 50% and 10% or between 50% and 30% inclusive of its original value. The reduction of the vertical layer thickness T results in minimizing the possible defect surface, for example by local enlargement of the joint interface 1131, and thus in improving the mechanical connection between the wafer composite 200 and the carrier composite 10.

According to FIG. 1E, separating trenches 60 are produced at least throughout the base body 13. The separating trenches 60 illustrated in FIG. 1E also extend in regions throughout the contact structure 8 and the insulating layer 34. The semiconductor body composite 20 can be exposed in places in the separating trenches 60. The separating trenches 60 can be produced by an etching process, preferably by a so-called Bosch-process, for instance by depth reactive ion etching (DRIE). For example, a mask is formed on a surface of the carrier composite 10 facing away from the wafer composite 200 in particular by photo-lithography using a photo-structurable material, wherein the mask defines the positions of the separating trenches 60. The mask can also be prefabricated and applied onto the carrier composite 10.

In FIG. 1E, the separating trenches 60 are formed during a first method step in such a way that at least the partial regions of the separating trenches 60 extending throughout the base body 13 form a grid structure 6. Along the vertical direction, the grid structure 6 does not extend or at most only partially extends into the semiconductor body composite 20. During a second method step different from the first method step, the separating trenches 60 are formed throughout the semiconductor body composite 20 (FIG. 1F). For example, the grid structure 6 formed by the separating trenches 60 can serve as an etching mask during the second method step, wherein the semiconductor body composite 20 is etched through for instance by guiding an etching agent into the grid structure 6. For example, the semiconductor body composite 20 is etched through for instance as far as the substrate 9 by reactive ion etching (RIE) for instance with chlorine as the etching agent. Alternatively, a mechanical method can be used for singulating the semiconductor body composite 20 into a plurality of semiconductor bodies.

According to FIG. 1E, prior to the formation of the separating trenches 60, the semiconductor body composite 20 is unstructured. The semiconductor body composite 20 is formed in particular in one piece. Only after the formation of the separating trenches 60 throughout the base body 13 (FIG. 1F), the semiconductor body composite 20 is structured into a plurality of semiconductor bodies 2. Thus, forming the separating trenches 60 throughout the base body 13 and forming the separating trenches 60 throughout the semiconductor body composite 20 are carried out at least partially by two mutually different method steps, wherein the grid structure 6 is generated in a first method step and the semiconductor body composite 20 is singulated in a second method step.

Figure 1G:
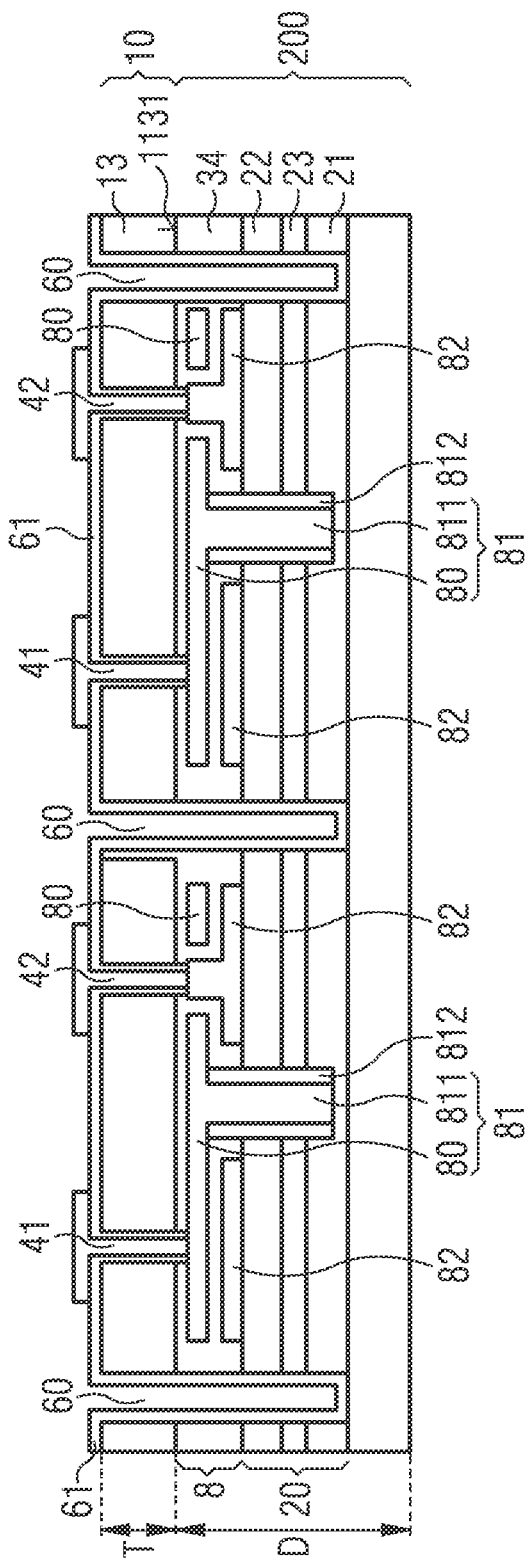

According to FIG. 1G, a passivation layer 61 is formed which completely covers the side surfaces of the separating trenches 60. In particular, the passivation layer 61 completely covers a rear side of the carrier composite 10 facing away from the wafer composite 200. Furthermore, the passivation layer 61 covers side surfaces of the through-contacts 41 and 42, which extend from the rear side of the carrier composite 10 throughout the base body 13 to the first connection layer 81 or to the second connection layer 82. By means of the through-contacts 41 and 42, the components to be produced are externally electrically back-connectable, that is to say via the rear side. In order to produce the through-contacts 41 and 42, recesses are formed for example throughout the base body 13 into the insulating layer 34 for partially exposing the first connection layer 81 and/or the second connection layer 82. Subsequently, the recesses can be filled with an electrically conductive material for forming the through-contacts 41 and 42. The first and second through-contacts are thus electrically conductively connected to the first and the second connection layers, respectively. The passivation layer 61 is formed in particular after the production of the separating trenches 60 throughout the semiconductor body composite 200 and/or after the formation of the through-contacts 41 and 42.

Figure 1H:
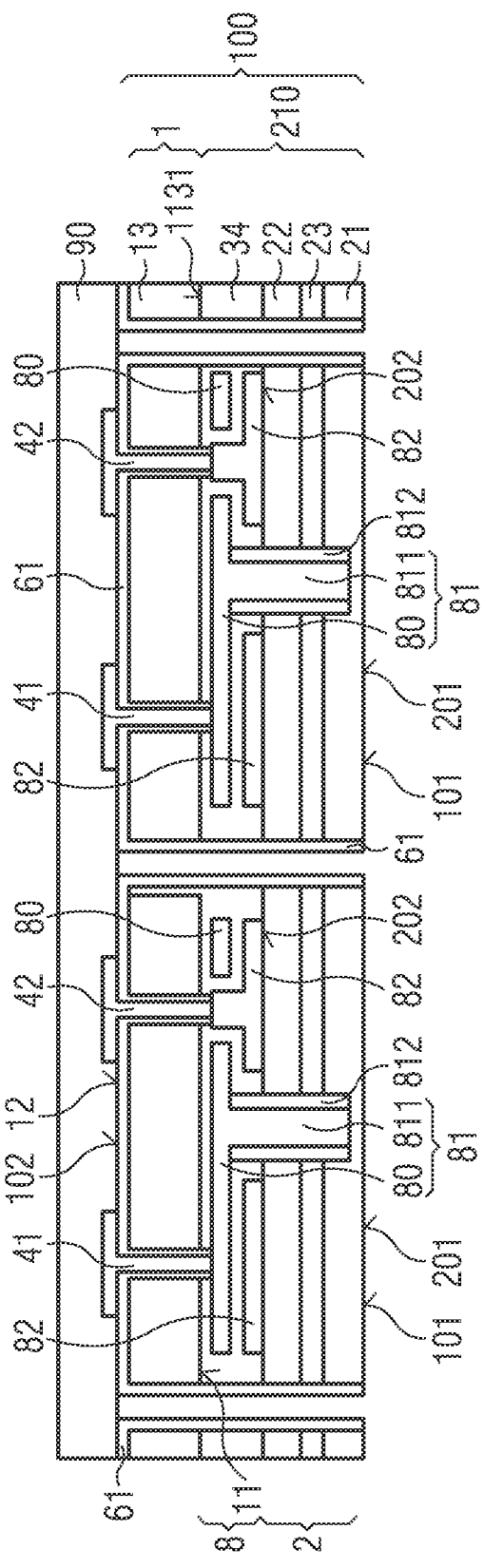

According to FIG. 1H, prior to the separation of the substrate 9, a for instance stretchable auxiliary carrier 90, for example in the form of a foil, is applied to the composite in such a way that the composite comprising the wafer composite 200 and the carrier composite 10 is arranged between the substrate 9 and the auxiliary carrier 90. Subsequently, the substrate 9 is removed from the semiconductor body composite 20 or from the semiconductor bodies 2 for instance by a mechanical and/or a chemical method and/or by a laser lift-off method. The composite comprising the carrier composite 10 and the wafer composite 200 is thus singulated into a plurality of components 100 in such a way that the components 100 each have a semiconductor body 2 as part of the semiconductor body composite 20 and a carrier 1 as part of the carrier composite 10. After the separation of the substrate 9 from the composite, the singulated components 100 are located in a particularly arranged manner on the auxiliary carrier 90 and can be processed further in a simplified manner.

In FIG. 1H, each component 100 has a carrier 1 and a main body 210 arranged on the carrier 1. The carrier 1 and the main body 210 have a joint interface 1131. The main body 210 comprises a semiconductor body 2 having an active layer 23 configured for generating radiation or for detecting radiation. The main body 210 further comprises a contact structure 8, which comprises a through-via 811, an insulation structure 812, a first connection layer 81 and a second connection layer 82.

The singulated components 100 each have one radiation passage surface 101, for instance formed by a first main surface 201 of the semiconductor body 2. In FIG. 1H, the radiation passage surface 101 is flat. In contrast to FIG. 1H, the radiation passage surface 101 of the component 100 can comprise out-coupling structures and thus be structured. The structuring of the radiation passage surface 101 can be realized prior to, during or after the separation of the substrate 9 from the semiconductor body composite 20. The component 100 comprises a rear side 102 facing away from the radiation passage surface 101. In particular, the rear side 102 of the component 100 is formed by a rear side 12 of the carrier 1. The component 100 is externally electrically connectable via the rear side 102 through the through-contacts 41 and 42. The entire side surfaces of the singulated component 100 are in particular completely covered by the passivation layer 61. In particular, apart from the through-contacts 41 and 42, the passivation layer 61 completely covers the rear side 102 of the component 100.

The exemplary embodiment illustrated in FIG. 2A for a method for producing a plurality of components substantially corresponds to the exemplary embodiment illustrated in FIG. 1D. In contrast to this, prior to wafer bonding, the semiconductor body composite 20 is structured in such a way that the semiconductor body composite 20 has a plurality of openings 25, in particular at locations of the separating trenches 60 to be formed. In this sense, the semiconductor body composite 20 is already partially structured prior to the formation of the separating trenches 60. The openings 25 are filled, in particular completely filled, with an electrically insulating material. For example, the insulating layer 34 has the same material as the material filling the openings 25.

In FIG. 2A, the openings 25 extend for instance from the second main surface 202 of the semiconductor body composite 20 through the second semiconductor layer 22 and the active layer 23 into the first semiconductor layer 21. Deviating therefrom, the openings 25 can extend as far as the substrate 9. In particular, the openings 25 are formed in a contiguous manner. Due to the openings 25, the semiconductor body composite 20 is divided into a plurality of semiconductor bodies which, according to FIG. 2A, however, comprise the common first semiconductor layer 21. The openings 25 and the further openings provided for instance for forming the through-via 811 can be formed in the same method step and can have the same vertical depth.

The exemplary embodiment illustrated in FIG. 2B for a method for producing a plurality of components substantially corresponds to the exemplary embodiment illustrated in FIG. 1E. In contrast hereto, the grid structure 6 having the separating trenches 60 is formed in such a way that the separating trenches 60 extend into the semiconductor body composite 20. Similar to the openings 25, the separating trenches 60 extend through the second semiconductor layer 22 and the active layer 23 into the first semiconductor layer 21. Deviating therefrom, the separating trenches 60 can extend as far as the substrate 9. In the region of the semiconductor body composite 20, the separating trenches 60 are formed at least in regions by partially removing the electrically insulating material located in the openings 25. Thus, during the formation of the separating trenches 60, the side surfaces of the separating trenches 60 are already covered by the remaining electrically insulating material in the region of the semiconductor body composite 20. Hence, the remaining material can form the passivation layer 61 at least in regions.

According to FIG. 2C, the separating trenches 60 are formed throughout the semiconductor body composite 20 in a further method step. In this case, only the first semiconductor layer 21 is structured in a self-adjusted manner to the grid structure for instance by an etching process. Thus, the semiconductor body composite 20 is separated into a plurality of individual semiconductor bodies 2. The individual semiconductor bodies 2 are arranged on the common substrate 9 and are in particular free of a common semiconductor layer. Further method steps, which are described for instance in FIGS. 1G and 1H, can also be applied to the exemplary embodiment shown in FIG. 2C. In particular, an electrically insulating material can be applied onto side surfaces of the separating trenches 60 and onto the carrier composite 10 in such a way that the passivation layer 61 formed in this way partially or completely covers the side surfaces of the separating trenches 60 and/or the side surfaces of the components 100 to be produced. It is likewise possible that for instance apart from the through-contacts 41 and 42, the rear sides of the respective singulated components 100 are completely covered by the passivation layer 61.

The exemplary embodiment illustrated in FIG. 3A for a method for producing a plurality of components substantially corresponds to the exemplary embodiment illustrated in FIG. 2A.

In contrast to the latter the substrate 9 comprises a structured surface facing towards the semiconductor body composite 20. In contrast to FIGS. 1A to 2C, the substrate 9 illustrated in these figures can likewise have a structured surface. The semiconductor body composite 20 is applied to the substrate 9 having the structured surface in such a way that the semiconductor body composite 20 also has a structured main surface facing the substrate 9. A further difference is that prior to the wafer bonding, that is to say prior to the connection of the wafer composite 200 to the carrier composite 10, the openings 25 filled with the electrically insulating material are already formed through the semiconductor body composite 200, for instance throughout the second semiconductor layer 22 and the active layer 23 into the first semiconductor layer 21 or as far as the substrate 9.

Analogous to FIGS. 1E and 2B, according to FIG. 3B, the layer thickness T of the carrier composite 10 is reduced. During a first method step, the grid structure 6 is generated by forming a plurality of separating trenches 60 throughout the base body 13. In contrast to the embodiments shown for instance in FIGS. 1E and 2B, the separating trenches 60 extend initially from a rear side of the carrier composite 10 facing away from the wafer composite 200 only to the joint interface 1131. According to FIG. 3B, during the formation of the grid structure 6, first openings 51 and second openings 52 are likewise produced at least throughout the base body 13 for partially exposing the first connection layers 81 and the second connection layers 82, respectively. In a subsequent method step, the first openings 51 and the second openings 52 can be filled with an electrically conductive material for forming first through-contacts 41 and second through-contacts 42. Such openings 51 and 52 of the base body 13 or of the carrier of the component to be produced can likewise be realized in FIGS. 1E and 2B during the formation of the grid structure 6. The formation of the openings 51 and 52, however, can be optional during the process of forming the grid structure 6 having the separating trenches 60.

The passivation layer 61 can be formed in part in such a way that it completely covers the side surfaces of the separating trenches 60 of the grid structure 6 being formed so far. Thus, in the region of the base body 13, the passivation layer 61 has partial regions which for instance completely cover the side surfaces of the subregions of the separating trenches 60 located within the main body 13 as well as the rear side 12 or 102 apart from the through-contacts 41 and 42. The passivation layer 61 can cover, in particular completely cover, the side surfaces of the first openings 51 and second openings 52.

The formation of the separating trenches 60 in the region of the semiconductor body composite 20 can be carried out exclusively by partially removing the electrically insulating material located in the openings 25 (FIG. 3C). An etching method or a mechanical method can be used for this purpose. Here, the side surfaces of the separating trenches 60 in the region of the semiconductor body composite 20 comprising the remaining electrically insulating material have been already covered for instance completely during the formation of the separating trenches 60 in the region of the semiconductor body composite 20. Hence, the remaining electrically insulating material can form the passivation layer 61 at least in part.

Furthermore, the exemplary embodiment illustrated in FIG. 3C showing the auxiliary carrier 90 substantially corresponds to the exemplary embodiment illustrated in FIG. 1H. In addition to this, already when the structured growth substrate 9 is detached, the singulated components 100 have in each case a structured main surface 101 or 201.

The priority of the German patent application 10 2016 101 347.1 is claimed, whose disclosure content is hereby included by reference.

The invention is not restricted to the exemplary embodiments by the description made with reference to exemplary embodiments. The invention rather comprises any novel feature and any combination of features, including in particular any combination of features in the claims, even if this feature or this combination is not itself explicitly indicated in the claims or exemplary embodiments.

LIST OF REFERENCE SIGNS

100 Component
101 Radiation passage surface
102 Rear side of the component
1 Carrier
10 Carrier composite
11 Connecting surface
12 Rear side of the carrier
13 Base body of the carrier
1131 Joint interface
2 Semiconductor body
20 Semiconductor body composite
21 First semiconductor layer
22 Second semiconductor layer
23 Active layer
25 Opening of the semiconductor body composite
200 Wafer composite
201 First main surface of the semiconductor body/composite
202 Second main surface of the semiconductor body/composite
31 Contact surface
34 Insulating layer
41 First through-contact
42 Second through-contact
51 First opening of the carrier
52 Second opening of the carrier
6 Grid structure
60 Separating trench
61 Passivation layer
8 Contact structure
80 Electrically conductive layer/mirror layer
81 First connection layer
82 Second connection layer
811 Through-via
812 Isolation structure
9 Substrate/growth substrate
90 Auxiliary carrier
D Layer thickness of the carrier composite
T Layer thickness of the wafer composite

The invention claimed is:

1. A method for producing a plurality of components comprising the following steps:
   providing a carrier composite having a contiguous base body;
   providing a wafer composite having a contiguous semiconductor body composite on a substrate;
   connecting the wafer composite to the carrier composite for forming a joint composite;
   forming a plurality of separating trenches at least throughout the base body for forming a grid structure which defines the dimensions of the components to be produced;
   forming a passivation layer covering side surfaces of the separating trenches; and
   singulating the joint composite, wherein the substrate is detached from the semiconductor body composite and the joint composite is singulated along the separating trenches into a plurality of components,
   wherein
      prior to the connection of the wafer composite to the carrier composite, the semiconductor body composite is formed in one piece and is free of mesa trenches which define the dimensions of the semiconductor bodies and thus of the components to be formed,
      sizes of the components to be produced are determined only during the forming of the grid structure comprising the separating trenches extending throughout the base body,
      prior to the formation of the separating trenches through the base body for forming the grid structure, the semiconductor body composite is unstructured, and
      only after the production of the separating trenches throughout the base body, the semiconductor body composite is structured into a plurality of semiconductor bodies in a self-adjusted manner to the grid structure.

2. The method according to claim 1,
in which the composite made of the carrier composite and the wafer composite is formed by a direct bonding method, in which the carrier composite having an exposed planar connecting surface is provided, the wafer composite having an exposed planar contact surface facing away from the substrate is provided, for forming the joint composite, the planar connecting surface and the planar contact surface are merged in such a way that a joint interface is formed by regions directly adjoining one another of the connecting surface and of the contact surface and is free of a connecting material.

3. The method according to claim 2,
wherein after connecting the wafer composite to the carrier composite material of the base body is removed in places in such a way that a vertical layer thickness of the base body is reduced.

4. The method according to claim 2,
wherein material of the composite is removed in places for reducing internal mechanical stresses, as a result of which the possible defect surface is narrowed at the joint interface.

5. The method according to claim 1,
wherein the base body is formed from an electrically insulating material or from a semiconductor material.

6. The method according to claim 5,
wherein the base body is formed from silicon and the carrier composite comprises a planar connecting surface which is formed by a surface of a silicon oxide layer.

7. The method according to claim 1,
wherein the production of the separating trenches throughout the base body and the production of the separating trenches through the semiconductor body composite are carried out at least partially by two mutually different method steps.

8. The method according to claim 7,
wherein the separating trenches are formed in a first method step in such a way that the separating trenches are produced throughout the base body, wherein after the first method step the separating trenches do not extend or at most only partially extend into the semiconductor body composite, and the separating trenches are produced throughout the semiconductor body composite in a second method step different from the first method step.

9. The method according to claim 8,
wherein the grid structure, which is formed by the separating trenches in the second method step, serves as an etching mask and the semiconductor body composite is etched through by guiding an etching agent into the grid structure.

10. The method according to claim 1,
wherein prior to the formation of the separating trenches, the semiconductor body composite is structured throughout the base body, wherein the semiconductor body composite has openings at locations of the separating trenches to be formed and the openings are filled with an electrically insulating material.

11. The method according to claim 10,
wherein the semiconductor body composite comprises a first semiconductor layer facing towards the substrate, a second semiconductor layer facing away from the substrate, and an active layer arranged between the semiconductor layers, wherein the openings extend throughout the second semiconductor layer and the active layer.

12. The method according to claim 11,
wherein the separating trenches in the region of the semiconductor body composite are formed at least in places by partially removing the electrically insulating material located in the openings in such a way that side faces of the separating trenches are covered by the remaining electrically insulating material which at least partially forms the passivation layer.

13. The method according to claim 11,
wherein the openings extend throughout the second semiconductor layer, the active layer and the first semiconductor layer as far as the substrate.

14. The method according to claim 13,
wherein the formation of the separating trenches in the region of the semiconductor body composite is carried out exclusively by partially removing the electrically insulating material located in the openings, so that the side surfaces of the separating trenches in the region of the semiconductor body composite are completely covered by the remaining electrically insulating material which at least partially forms the passivation layer.

15. The method according to claim 1,
wherein, during the formation of the grid structure, a plurality of openings are produced throughout the base body for the formation of through-contacts.

16. The method according to claim 1,
wherein
the substrate is a growth substrate comprising a structured surface on which the semiconductor body composite is epitaxially grown in such a way that the semiconductor body composite has a main surface which faces towards the growth substrate and reproduces the structured surface of the growth substrate, and the substrate is detached from the semiconductor body composite in such a way that in the course of the detachment of the growth substrate the singulated components each have a structured main surface.

17. The method according to claim 1,
wherein
prior to the formation of the separating trenches, the semiconductor body composite is structured throughout the base body for forming the grid structure, wherein the semiconductor body composite has openings at locations of the separating trenches to be formed and the openings are filled with an electrically insulating material, and the separating trenches in the region of the semiconductor body composite are formed at least in places by partially removing the electrically insulating material located in the openings in such a way that the side faces of the separating trenches are covered by the remaining electrically insulating material which at least partially forms the passivation layer.

18. The method according to claim 1,
wherein
the separating trenches are formed in a first method step in such a way that the separating trenches are produced throughout the base body, wherein after the first method step the separating trenches do not extend or at most only partially extend into the semiconductor body composite, and the separating trenches are produced throughout the semiconductor body composite in a second method step different from the first method step, wherein the grid structure, which is formed by the separating trenches in the second method step, serves as an etching mask and the semiconductor body composite is etched through by guiding an etching agent into the grid structure.

\* \* \* \* \*